(12) United States Patent
Hayton et al.

(10) Patent No.: US 9,287,326 B2
(45) Date of Patent: Mar. 15, 2016

(54) DISTORTION TOLERANT PROCESSING

(71) Applicant: Flexenable Limited, Cambridge, Cambridgeshire (GB)

(72) Inventors: Carl Hayton, Cambridge (GB); Paul Cain, Cambridge (GB)

(73) Assignee: FLEXENABLE LIMITED, Cambridge, Cambridgeshire (GB)

( * ) Notice: Subject to any disclaimer, the term of this patent is extended or adjusted under 35 U.S.C. 154(b) by 0 days.

(21) Appl. No.: 14/491,697

(22) Filed: Sep. 19, 2014

(65) Prior Publication Data

US 2015/0129850 A1   May 14, 2015

Related U.S. Application Data

(62) Division of application No. 12/444,152, filed as application No. PCT/GB2007/050599 on Oct. 1, 2007, now Pat. No. 8,859,312.

(30) Foreign Application Priority Data

Oct. 3, 2006 (GB) .................................. 0619548.1
Aug. 28, 2007 (GB) .................................. 0716608.5

(51) Int. Cl.
*H01L 27/28* (2006.01)
*G03F 7/20* (2006.01)
(Continued)

(52) U.S. Cl.
CPC .......... *H01L 27/283* (2013.01); *G03F 7/70791* (2013.01); *H01L 27/124* (2013.01); *H01L 51/0018* (2013.01); *H01L 51/0097* (2013.01); *H01L 51/0541* (2013.01)

(58) Field of Classification Search
CPC ..................... H01L 23/3107; H01L 23/49548; H01L 23/3128; H01L 23/4334; H01L 21/4871; H01L 27/283; H01L 51/0097; H01L 27/124

USPC ................... 257/685, 780, 778, 355; 438/122
See application file for complete search history.

(56) References Cited

U.S. PATENT DOCUMENTS 5,301,124 A   4/1994   Chan et al.
6,580,494 B1   6/2003   Hall et al.
(Continued)

FOREIGN PATENT DOCUMENTS

GB   2388709 A   11/2003
JP   63-100724   5/1985
(Continued)

OTHER PUBLICATIONS

English translation of Japanese Office Action issued Aug. 27, 2013 in Japanese Patent Application No. JP 2009-530948.
(Continued)

*Primary Examiner* — Kenneth Parker
*Assistant Examiner* — Bo Fan
(74) *Attorney, Agent, or Firm* — Knobbe Martens Olson & Bear LLP

(57) ABSTRACT

An integrated circuit (IC) for driving a flexible display includes a first layer including spatially non-repetitive features, the first layer deposited on a flexible substrate, the spatially non-repetitive features not substantially regularly repeating in both of two orthogonal directions (x,y) in the plane of the substrate. The IC further includes a second layer including spatially repetitive features with the second layer being deposited on said first layer. The first and second layers are aligned to one another so as to allow electrical coupling between said non-repetitive and said repetitive features, and wherein distortion compensation is applied during deposition of said repetitive features to enable said alignment.

9 Claims, 10 Drawing Sheets

(51) Int. Cl.
*H01L 51/00* (2006.01)
*H01L 51/05* (2006.01)
*H01L 27/12* (2006.01)

(56) References Cited

U.S. PATENT DOCUMENTS

| | | | |
|---|---|---|---|
| 2002/0079501 A1 | 6/2002 | Okada et al. | |
| 2003/0059975 A1 | 3/2003 | Sirringhaus et al. | |
| 2006/0250558 A1* | 11/2006 | Burns | G02B 5/201 349/139 |

FOREIGN PATENT DOCUMENTS

| | | |
|---|---|---|
| JP | 10-261586 | 9/1998 |
| JP | 2005/043424 | 2/2005 |
| WO | WO 03/019275 | 3/2003 |
| WO | WO 2006/036020 | 4/2006 |
| WO | WO 2006/059162 | 6/2006 |
| WO | WO 2007/026174 | 3/2007 |

OTHER PUBLICATIONS

English translation of Japanese Office Action issued Dec. 4, 2012 in Japanese Patent Application No. JP 2009-530948.
European Office Action re Application No. 07 804 502.8 dated May 17, 2013.
International Search Report for Application No. GB0716608.5 dated Jan. 6, 2008 in 2 pages.
International Search Report for International Application No. PCT/GB2007/050599, Dated Jan. 23, 2008.

\* cited by examiner ns, filed Oct. 3, 2006 and United Kingdom Application No. 0716608.5, filed Aug. 28, 2007.

DISTORTION TOLERANT PROCESSING

CROSS-REFERENCE TO RELATED APPLICATIONS

This application is a divisional of U.S. patent application Ser. No. 12/444,152, filed on Dec. 17, 2009 and issued as U.S. Pat. No. 8,859,312, which is the U.S. National Phase under 35 U.S.C. §371 of International Application No. PCT/GB2007/050599, filed Oct. 1, 2007, designating the United States and published in English on Apr. 10, 2008, as WO 2008/041027, which claims priority to United Kingdom Application No. 0619548.1, filed Oct. 3, 2006 and United Kingdom Application No. 0716608.5, filed Aug. 28, 2007.

FIELD OF THE INVENTION

The present invention relates to a distortion-tolerant method of processing an integrated circuit, incorporating a flexible substrate or a substrate that is susceptible to distortion.

DESCRIPTION OF RELATED ART

A route for achieving more cost-effective electronics such as large-area displays and RFID circuits at higher throughputs than are available using conventional inorganic semiconductor processing is required within organic electronics. In order to achieve devices such as large area displays and high-speed logic circuits, conduction pathways in the form of electrodes and interconnects, and other patterns such as semiconducting active layer islands or via-hole interconnections are required on more than one level within the device stack. In order to achieve the required conductivity for the conduction pathways, metallic conductive layers are often necessary. However, in comparison with conventional inorganic semiconductor wafer processing, there are no known methods within organic electronics of providing metallic conductivity pathways on flexible substrates with high resolution (<10 mm) and without using a high temperature process step (<80° C.) at higher throughput than what can be achieved with conventional photolithography. Various known processes satisfy some but not all of these requirements. For example, the technique of ink jet printing metal nano-particle solutions followed by laser annealing achieves high conductivity at low temperature, but is only capable of low resolution and low throughput. Similarly, the technique of thermal transfer printing has reasonably high resolution (~10 mm) and low process temperature but usually yields low conductivity or low throughput.

Photolithography is a process used within the integrated circuits industry and specifically in the microfabrication process involved in the manufacture of device integration. This method consists of the steps of photographic etching using a light source. The process allows for intricate patterns to be created within integrated circuits upon exposure to a light source through a single mask covering a large area. Such processes have been well developed and are used as standard methods of forming intricate details within the integrated circuits industry. The process of photolithography uses a photomask which contains the pattern to be produced within the integrated circuit. The photomask is mounted on the substrate and a light source is shone through the mask onto a substrate, therefore transferring the pattern to the underlying resist-coated substrate, which is in-turn developed.

Exposure apparatus used for photolithography processes capable of superimposing pattern images with a high accuracy for fabricating semiconductor devices, is disclosed in patent number U.S. Pat. No. 6,721,033. In such processes, step and repeat methods are known where an image of the circuit pattern is projected onto a silicon substrate. During the various process steps, distortion is known to occur, such as strain or deformation of the image due to factors such as the external environment, magnification or rotation. The apparatus disclosed includes a moveable substrate stage and a memory device, which stores distortion information of the pattern image generated in accordance with an exposure position on the substrate when the pattern image is being transferred onto the substrate. However, as a silicon substrate is disclosed, the level of distortion of the substrate is limited.

A known method of patterning the various layers of a device, such as the conductive layers described above, is the use of pulsed lasers to ablate regions of a deposited layer, or to delaminate one thin layer of material from the surface of a usually thicker, second layer of a different material. Laser ablation patterning can in principle be done by scanning a single or a number of focused laser beams across the substrate and turning the laser beams on and off to achieve an arbitrary desired exposure pattern. However, in many situations higher throughput can be achieved by exposing the substrate to the laser radiation through a shadow mask.

Mask-based patterning processes generally involve aligning a second mask pattern to a pre-patterned first layer, with high alignment tolerance required over the entire area. For small substrates the mask can be the same size as the substrate area to be patterned (1:1 scaling), and the whole area is imaged without moving the mask relative to the substrate. If the substrate area is too large to 'illuminate' the entire area to be patterned with a single mask exposure, which is often the case for large area, high resolution applications, then a diamond or other polygon-shaped light source is often scanned over the substrate (either by moving the mask and substrate together, or by scanning the light source) in such a manner that the product of the intensity and exposure time is a constant as a function of position, usually achieved using so-called serpentine scanning.

A problem arises when the substrate is flexible and therefore susceptible to distortion, i.e. the substrate changes shape in between processing step, such that mask patterns for upper layers do not match the distorted pattern on an underlying layer. It is then not possible to correctly align the rigid mask to all points of the substrate simultaneously. Some imaging equipment compensates for some of the linear distortion by moving the mask relative to the substrate as the substrate/mask system is scanned past the light source.

In patent number U.S. Pat. No. 6,580,494, a step and repeat process of imaging arrays of devices is disclosed. If the substrate is distorted equally in both axes, then an adjustment in the magnification of the mask image enables this distortion to be corrected for.

However, if the distortion in each axis is unequal, then the method of magnifying the mask image for larger arrays will not adequately compensate for the distortion. The prior art overcomes this problem by making the mask longer in one axis than the other, and adjusting the magnification to suit the longer axis. The relative change in size of the image will be the same in any axis, but the absolute change in image length in the shorter axis will be much smaller than that in the longer axis. This unwanted change along the shorter axis can be tolerated in the pattern design. However, there are limitations to the amount of distortion that this method of compensation can correct for, in particular due to the fact that the masks described within the disclosure are not able to be reduced significantly in size as this will affect the throughput. In addition, this process requires the lens magnification to be changed at every imaging site.

SUMMARY OF THE INVENTION

The present invention can be used with a nano-second pulse-length laser such as a pulsed excimer laser to pattern upper regular-arrays of electronic devices in a step-and-repeat mode as is described in GB0523141.0. This disclosed step-and-repeat technique provides a method of fabricating thin film transistor (TFT) structures by forming electrodes, such as gate electrodes and interconnect lines by a method of laser ablation. In this mode a region of the substrate is exposed to the laser radiation, for example with a pattern defined by an optical mask, and the layer to be patterned is ablated. Then the sample is moved to another location with respect to the mask pattern projected onto the sample, and another ablation exposure occurs to pattern the layer in an adjacent region in a step-and-repeat fashion. Using this method to continuously pattern a layer on the substrate (without gaps) it is necessary to define overlap regions within which the substrate is exposed to the laser radiation from more than one step (as described in patent number GB0523141.0). This step-and-repeat method is limited to patterning of periodic patterns that repeat themselves over a certain period, such as the patterns required for defining an active-matrix array of TFTs in a display. In this method distortion correction is achieved by adjusting the relative position of individual exposure areas with respect to each other in order to maintain accurate alignment between the upper layer patterned by the laser with respect to lower layer patterns defined previously. However, one drawback of this approach is that it is not applicable to features that are not periodic such as the interconnect patterns, alignment marks, bonding pads and tab out patterns on the edge of a display.

The present invention concerns imaging at speed, and as a result, small mask sizes may be used and the throughput is not affected. The linear distortion tolerance may be up to ~2000 ppm or more because the mask is allowed to overlap on each field, and no adjustment of the magnification is required, as the mask is small enough that lateral mask placement adjustment is sufficient to give good device operation. This makes the process faster, since adjusting the magnification of the image at each site is time consuming, and cannot be done at speed.

In the present invention, there are no concerns about choosing a magnification to suit the difference in distortion in each axis due to the fact that no adjustment of the magnification of the lens is required. The mask location is shifted and a small mask size is used, which is apt for the current process as the imaging occurs on the fly and at speed with the use a pulsed laser beam.

The present invention addresses the above disadvantages to provide a method of processing an integrated circuit containing non-periodic patterns using a step-and-repeat laser ablation approach with the ability to compensate for upper layer distortion when patterning a flexible or a distortion-susceptible substrate. The method is based on designing the device structure and layout of the integrated circuit in such a way that all non-repeating patterns are placed on the lower layer of the device.

According to the present invention, there is provided a method of manufacturing an integrated circuit (IC) for driving a flexible display, comprising: depositing a pattern of spatially non-repetitive features in a first layer on a flexible substrate, said pattern of spatially non-repetitive features not substantially regularly repeating in both of two orthogonal directions (x,y) in the plane of the substrate; depositing a pattern of spatially repetitive features in a second layer on said first layer; aligning said second layer and said first layer so as to allow electrical coupling between said non-repetitive features and said repetitive features, wherein distortion compensation is applied during deposition of said repetitive features to enable said alignment.

Placing the non-repetitive features in the first layer enables to the features to be patterned by any technique without the need for distortion compensation to be applied (to compensate for distortion in the flexible substrate that occur during manufacture). Furthermore, since the non-repetitive features are on the first layer, there are no underlying features to which the non-repetitive features must be accurately aligned. Distortion compensation therefore need only be applied during the deposition of the repetitive features.

In embodiments, said distortion compensation comprises performing a step and repeat deposition process comprising: depositing a portion of said pattern of repetitive features in a first area of said second layer; translating said substrate from a first position at which said first area of said second layer is depositable to a second position at which a second area of said second layer is depositable; depositing a further portion of said pattern of repetitive features in said second area; and repeating said step and repeat deposition process to deposit said repetitive features. Preferably, the distance between said first position and said second position is selected to correct for distortions in said flexible substrate.

In embodiments, deposition comprises: depositing a material; and patterning said material to define said feature. In embodiment, said material is deposited and patterned substantially at the same time by printing said material in a pattern onto said layer. In other embodiments, patterning said material comprises selectively exposing said material to a light source to define said pattern in said material. Preferably, said light source is a laser, and wherein said material is laser ablated.

In embodiments, said non-repetitive features are deposited along an edge portion of said first layer. Preferably, said non-repetitive features comprise one or more of data lines, interconnects for thin film transistors, flexible connectors, test patterns, and alignment marks. Preferably, said repetitive features comprise one or more of source, drain and gate electrodes for thin film transistors. Preferably, said repetitive features on said second layer are electrically coupled to said non-repetitive features on said first layer by via connectors between said second and first layers. Preferably, said non-repetitive features are deposited on the lowest layer of said substrate.

In embodiments, said first layer further comprises repetitive features, and wherein said repetitive features are electrically coupled to said non-repetitive features.

Preferably, one or both of said repetitive and non-repetitive features comprises an organic solution-processed polymer semiconductor. Preferably, said flexible substrate comprises polyethyleneterephtalate (PET) or polyethylenenaphtalene (PEN).

Preferably, said non-repetitive features comprise one or more of data lines, interconnects for thin film transistors, flexible connectors, test patterns, or alignment marks. Preferably, said repetitive features comprise one or more of source, drain or gate electrodes for thin film transistors. Preferably, said integrated circuit is an active matrix driver for driving a flexible display.

According to the present invention, there is also provided an integrated circuit (IC) for driving a flexible display, comprising: a first layer comprising spatially non-repetitive features, said first layer being deposited on a flexible substrate, and said spatially non-repetitive features not substantially regularly repeating in both of two orthogonal directions (x,y) in the plane of the substrate; and a second layer comprising spatially repetitive features, said second layer being deposited on said first layer, wherein said first and second layers are aligned to one another so as to allow electrical coupling between said non-repetitive and said repetitive features, and wherein distortion compensation is applied during deposition of said repetitive features to enable said alignment.

Placing the non-repetitive features in the first layer enables to the features to be patterned by any technique without the need for distortion compensation to be applied (to compensate for distortion in the flexible substrate during manufacture). Furthermore, since the non-repetitive features are on the first layer, there are no underlying features to which the non-repetitive features must be aligned. Distortion compensation therefore need only be applied during the deposition of the repetitive features.

In embodiments, said non-repetitive features are deposited along an edge portion of said first layer. Preferably said non-repetitive features comprise one or more of data lines, interconnects for thin film transistors, flexible connectors, test patterns, and alignment marks. Preferably, said repetitive features comprise one or more of source, drain and gate electrodes for thin film transistors.

Preferably, said repetitive features on said second layer are electrically coupled to said non-repetitive features on said first layer by via connectors between said second and first layers. Preferably, said non-repetitive features are deposited on the lowest layer of said substrate.

In embodiments, said first layer further comprises repetitive features, and wherein said repetitive features are coupled to said non-repetitive features.

Preferably, one or both of said repetitive and non-repetitive features comprises an organic solution-processed polymer semiconductor. Preferably, said flexible substrate comprises polyethyleneterephtalate (PET) or polyethylenenaphtalene (PEN). Preferably, said integrated circuit is an active matrix driver for driving a flexible display.

The present invention also provides a method of compensating for distortion in a flexible substrate during manufacture of an integrated circuit (IC) for a flexible display, comprising: depositing a pattern of spatially non-repetitive features on a flexible substrate to form a lower layer, said pattern of spatially non-repetitive features not substantially regularly repeating in both of two orthogonal directions (x,y) in the plane of the substrate; and depositing a pattern of spatially repetitive features on top of said lower layer to form an upper layer; wherein distortion compensation is applied during deposition of said repetitive features so as to allow said first and second layers to be aligned with one another.

Preferably, said upper and lower layers are aligned so as to allow electrical coupling between said non-repetitive and said repetitive features.

In embodiments, said distortion compensation comprises: performing a step and repeat deposition process comprising: depositing a portion of said repetitive features in a first area of said second layer; translating said substrate from a first position at which said first area of said second layer is depositable to a second position at which a second area of said second layer is depositable; depositing a further portion of said repetitive features in said second area; and repeating said step and repeat deposition process to deposit said repetitive features.

Preferably, the distance between said first position and said second position is selected to correct for distortions in said flexible substrate.

The present invention further provides a method of compensating for distortion in a flexible substrate during manufacture of an integrated circuit (IC) for a flexible display, comprising: depositing a pattern of features along an edge portion of a flexible substrate to form a lower layer; and depositing a pattern of features in a central portion on top of said lower layer to form an upper layer; wherein distortion compensation is applied during deposition of said central features so as to allow said first and second layers to be aligned with one another.

According to a preferred embodiment of the present invention a method is disclosed for manufacturing an integrated circuit containing non-repetitive patterns that are electrically connected to functional elements of the integrated circuit on upper layers. The method is based on integrating all said non-repetitive patterns into a single lower layer of the integrated circuit which can be patterned by any patterning technique because for such a lower layer pattern no distortion compensation is required, since the substrate contains no other critical features prior to this patterning step. Preferably, said lower of the integrated circuit is the first layer of the integrated circuit that is being patterned, which does not need to be aligned with respect to any previously deposited pattern. No alignment is required for this primary patterning step, since there are no other existing features on the blank substrate to align to. Alternatively, the lower layer may be placed on top of another low-resolution patterned layer, which only requires coarse alignment between said lower layer and said low-resolution patterned layer.

In the case of an active matrix display circuit the non-repetitive pattern to be placed on the lower layer might contain interconnects that link the data lines on the source-drain level as well as gate interconnect lines to the row-and-column driver chips or the flexible connectors mounted on the edge of the display, as well as non-periodic alignment marks and test structures. These non-repetitive patterns on the lower layer can be integrated together with periodic patterns such as the source-drain and pixel electrodes of the active matrix array in the case of a top-gate thin film transistor (TFT) architecture, or the gate electrodes in the case of a bottom-gate TFT architecture.

Non-repetitive means not substantially regularly repeating in both of two orthogonal directions (x,y) in the plane of the substrate. Repetitive includes periodic or regularly spaced similar or at least in part substantially corresponding spatial features.

The integrated circuit and device structure is designed and laid out in such a way that the upper layer which is patterned by step-and-repeat patterning only contains periodic, repetitive patterns. The upper layer can then be patterned by any step-and-repeat patterning technique capable of accurate distortion compensation to align the periodic features of the upper layer to periodic features defined in the lower layer. Examples of such step-and-repeat patterning techniques include step-and-repeat photolithography and laser ablation. The distortion compensation is achieved by adjusting the relative position of individual exposure areas with respect to each other in order to maintain accurate alignment between the upper layer patterned by the laser with respect to the lower layer pattern defined previously.

The method of processing also includes establishing a number of via-hole interconnections that electrically connect the some of the periodic features defined in the upper layer to the non-periodic features defined on the lower layer. Preferably, such via-hole interconnections are formed by a process of laser ablation.

Preferably the upper layer patterning is achieved by selective laser ablation patterning (SLAP). This technique disclosed in GB0513915.9 and its entire content is included in the present application by way of reference. SLAP allows patterning by laser ablation of metallic layers on upper layers of a device without radiation induced damage of lower, underlying layers. It uses short pulse lasers for the fabrication of thin film transistor (TFT) structures. This technique incorporating laser ablation uses a single shot per imaging area of a short pulse laser to pattern layers of metallic material on top of underlying layers in order to produce fine features of a TFT device. An example is the patterning of a gold gate electrode of a top-gate organic TFT with underlying gate dielectric, active semiconductor and conducting source-drain electrode layers. This technique may be performed without destroying or substantially degrading the performance of these sensitive elements, such as the semiconductor layer and the source-drain electrodes. This is due to the short pulse length allowing much of the energy to enter the material and to be absorbed within the layer to be ablated which will result in the act of ablation before any substantial thermalization actually occurs, that can lead to degradation/ablation of underlying layer. In addition, this technique may be used to finely tune the source and drain electrode formation after a coarser laser ablation process, resulting in the substantial elimination of burring edges that could lead to electrical shorts. In addition, this technique is able to be used to remove small areas of unwanted conductive material, for example, those that have been formed as a result of the production of debris. This technique can be employed for patterning of metal electrodes and interconnects on the various upper levels of the device in a step-and-repeat fashion. We note that for a large-area substrate the substrate area which can be exposed in a single step is limited by the laser intensity needed for ablation, and the required accuracy of distortion compensation. The distortion compensation with the SLAP technique is achieved by adjusting the relative position of individual exposure areas with respect to each other in order to maintain accurate alignment between the upper layer patterned by the laser with respect to the lower layer pattern defined previously, and by laying out the circuit in such a way that in the overlap areas where multiple exposures occurs no damage is down to functional layers, in particular interconnects (see patent application GB0523141.0).

BRIEF DESCRIPTION OF THE DRAWINGS

To help understanding of the invention, a specific embodiment thereof will now be described by way of example and with reference to the accompanying drawing, in which.

DETAILED DESCRIPTION OF PREFERRED EMBODIMENTS

Example: A low cost method of processing an active-matrix display with top-gate TFT architecture containing non-repetitive patterns on a distorted flexible substrate.

In the case of an active matrix display with top-gate TFT architecture the non-repetitive pattern to be placed on the lower layer contains interconnects that link the data lines on the source-drain level as well as gate interconnect lines to the row-and-column driver chips or the flexible connectors mounted on the edge of the display, as well as non-periodic alignment marks and test structures.

These non-repetitive patterns on the lower layer can be integrated together with periodic patterns such as the source-drain of the active matrix array while the gate electrodes and gate interconnects, semiconducting active layer island, common electrode structures, and any pixel electrode patterns need to be laid out as periodic patterns on an upper layer. Particularly accurate relative alignment is required between the lower-layer source-drain electrode pattern and the upper-layer gate electrode pattern to avoid variations in the overlap capacitance.

The patterning steps of the periodic elements on the upper layers of the device are patterned in a step-and-repeat fashion. The mask design does not cover and pattern the entire array on the substrate, but patterns a smaller number of pixels at a time, provided that the number of pixels covered by each mask is a divisor of the total number of pixels, in each axis. This process therefore enables each exposure area to be patterned individually, and locally aligned with respect to underlying patterns. In this way, the local distortion compensation can be achieved. A preferred technique for upper layer patterning is exposure to a pulsed laser beam. Typical exposure conditions are from a 100 mJ cm-2 spatially uniform (within 10%) laser pulse fired at the area to be ablated (248 nm, 30 ns laser pulse) from an excimer laser.

Figure 1:
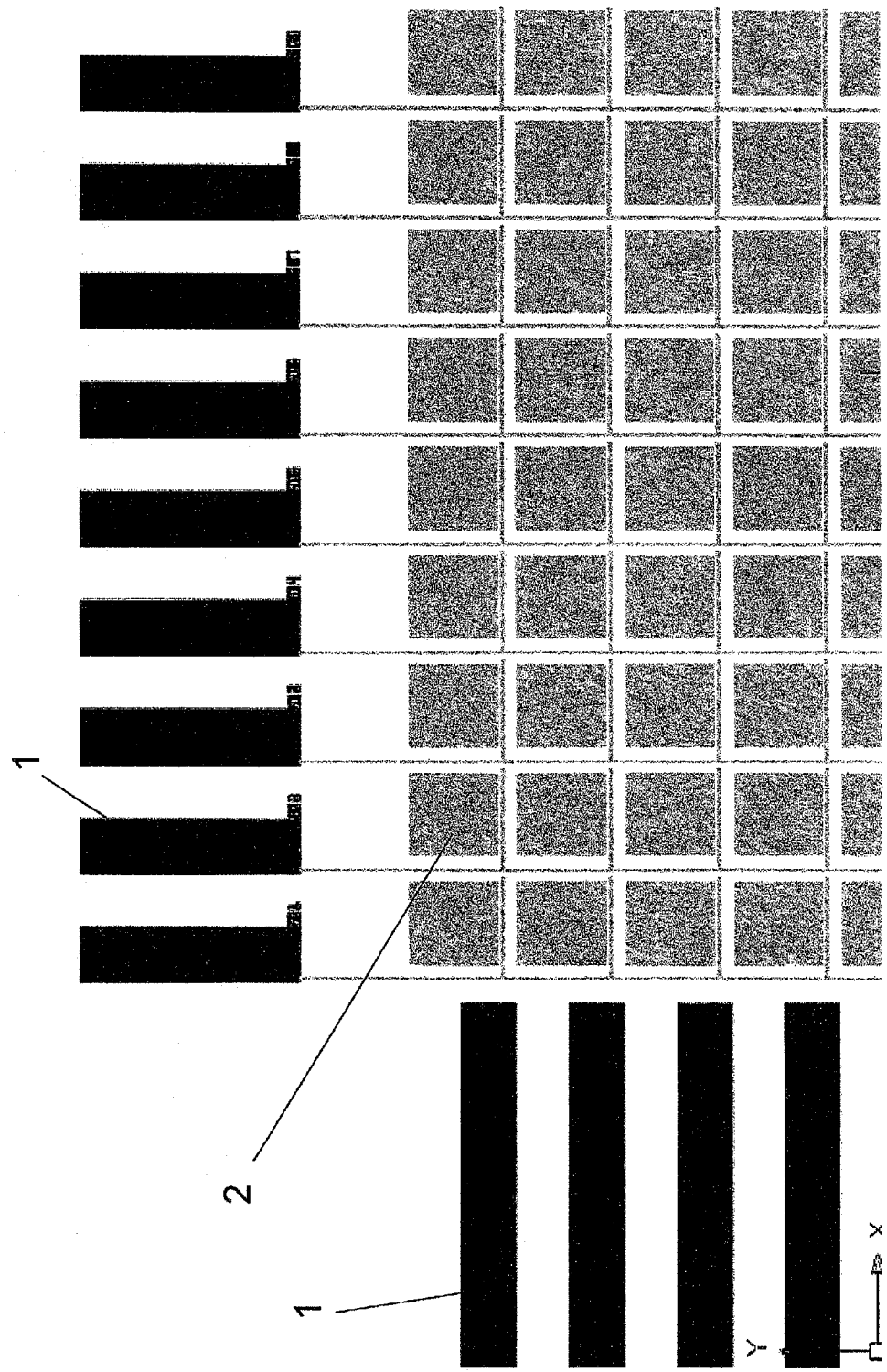
FIG. 1 shows source and drain patterning including all non-array patterns.

With reference to the figures, the invention is now described in detail. A substrate is coated with a thin layer of conductive material. The substrate may be either glass or a planarised polymer film. According to a preferred embodiment of the invention the substrate is a plastic substrate, such as a film of polyethyleneterephtalate (PET) or polyethylenenaphtalene (PEN). A first conductive layer, which is preferably a metallic layer, and most preferably a layer of inorganic metal such as gold or silver may also be used or any metal that adheres well to the substrate. Alternatively, a conductive polymer may be used, such as PEDOT/PSS. The conductive material is preferably deposited using solution processing techniques such as spin, dip, blade, bar, slot-die, or spray coating, inkjet, gravure, offset or screen printing. An evaporation process may also be used to deposit a metallic layer, but preferably a sputtering technique is used. The first conductive layer may be patterned to form the initial underlying conductive features, such as the source and drain electrodes, as is shown in FIG. 1. In addition, the data interconnects are formed, as well as the interconnects that connect the TFT array to the driver chips or flexible connectors on the edge of the display, and any alignment marks and test structures. The first conductive layer pattern includes these interconnect structures for both the data interconnects as well as the gate interconnects. The initial irregular arrays 1 (see FIG. 1) formed on these lower layers of the device, incorporating elements such as the interconnects may be patterned using standard patterning techniques. Such standard patterning techniques include, but are not limited to, photolithography, laser ablation or direct-write printing. Other processes that may be used include shadow mask evaporation or other printing and etching methods. No distortion compensation is needed at this stage when patterning irregular arrays.

Subsequently a sequence of further conducting, dielectric and semiconducting layers is deposited on top of the first conductive patterned layer.

Figure 2:
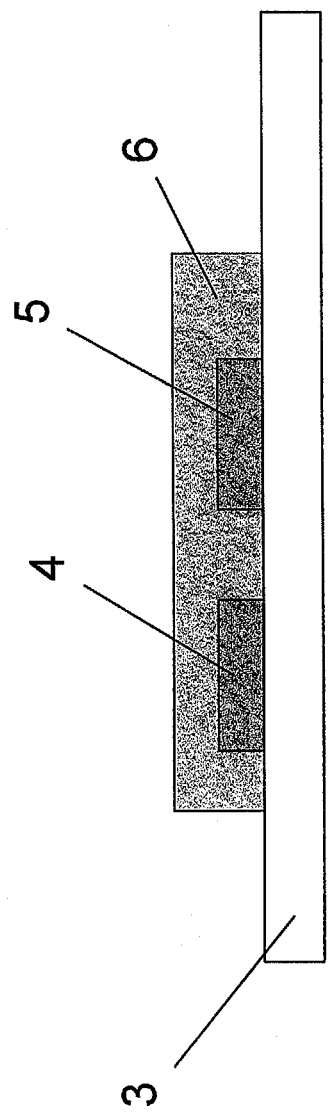
FIG. 2 illustrates the deposition of the semiconductor layer over the patterned source and drain electrodes.

In the case of a transistor device in top-gate configuration, once the initial metallic layer. 4, 5 has been patterned to form the irregular array of elements a layer of semiconducting material 6 is deposited over the substrate is as seen in FIG. 2. The semiconducting layer may comprise an organic semiconductor, such as, but not limited to, polyarylamine, polyfluorene or polythiophene-based semiconducting polymers or small molecule semiconductors such as pentacene or rubrene. Alternatively, inorganic semiconductors, such as vacuum deposited amorphous or polycrystalline silicon, or solution-deposited inorganic nanomaterials, such as colloidal nanoparticles or nanowires can be used.

A broad range of deposition techniques may be used to deposit the semiconducting material including, but not limited to, blade coating dip coating, curtain coating, meniscus coating, spray coating, or extrusion coating, inkjet printing, offset printing, gravure printing or flexographic printing. The typical thickness of the semiconducting layer is on the order of 50-100 nm after solvent evaporation. In addition, an evaporative process may also be used. A preferred technique is ink jet printing. If the layer is ink jet printed, a minimum amount of semiconductor material may be used, which is both environmentally and economically advantageous. As is explained below, in a top gate configuration, the semiconductor layer is the first layer of the device to be patterned in a regular array using a mask patterning technique in order to isolate the semiconductor material.

Figure 3:
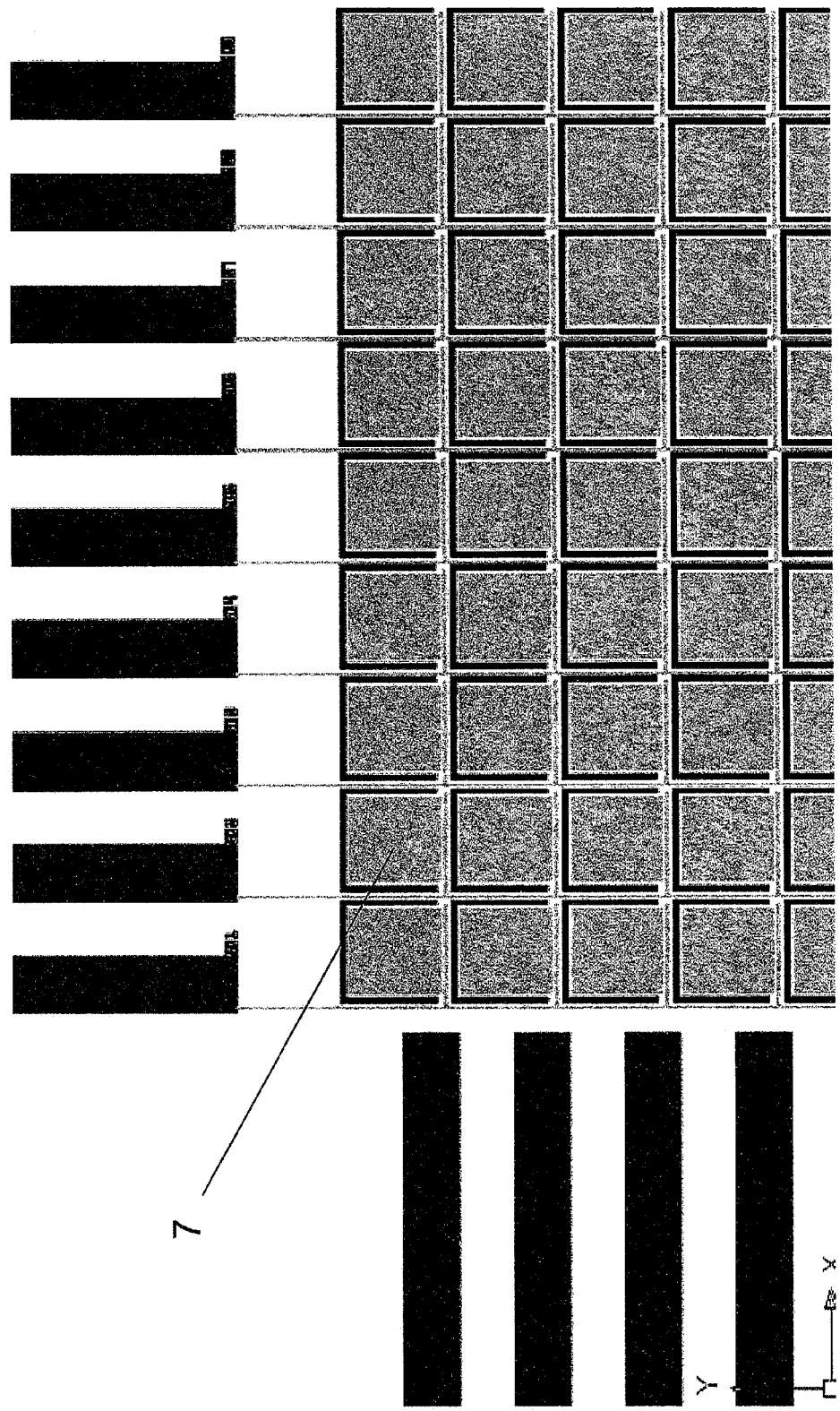
FIG. 3 shows an underlying first array patterning step of the semiconductor material.

At this stage, all of the deposition and patterning of any irregular arrays of elements of the device for a top gate configuration is complete as is seen in FIG. 1. A mask-based process of patterning the upper regular arrays of the device is then able to be performed as is illustrated in FIGS. 2-6. FIG. 3 shows the first patterning step of the regular array of semiconductor patterning 7. Since all subsequent patterning steps are patterning a regular block-array of elements, a chosen suitable mask need not contain the entire array of the device, but could cover a smaller area of the regular device array, therefore patterning a smaller number of pixels, thus allowing each small area to be locally aligned to tolerate any substrate distortion. However, there is a requirement that the number of pixels that an individual mask is able to pattern is a divisor of the total number of pixels of the device, in each axis. For instance, if a display contains 800×600 pixels that are to be patterned, then the individual mask need not cover the entire array, but could instead just contain 80×60 pixels, or 4×3 pixels (or simply 1×1).

The advantages of this process having the possibility of using masks of varying sizes, allows each masked block-array to be patterned individually. Therefore, each area of the array that is covered by a mask is essentially a separate exposure to the laser beam and can therefore be separately and locally aligned to the existing primary pixel pattern. This allows any distortion of the flexible substrate 3 to be compensated for during the patterning at each ablation step. The size of the mask is limited by the accuracy of distortion compensation which is needed. If the distortion is significant and a high relative alignment between the upper level pattern and any lower level pattern is needed then a smaller mask size may be used to compensate for this, in order to enable a smaller area of the device to be patterned for each laser exposure.

An additional benefit of the above described process is that any features that need to be patterned continuously over the entire substrate may be accounted for. In this instance, a small overlap region is required at the edge of each mask such that the effect of locally positioning the masks to allow for distortion does not open up a small gap between in between the masks (as described in patent number GB0523141.0).

The semiconductor layer is patterned into a periodic array of active layer islands 7 as is shown in FIG. 2. Preferably, the semiconducting layer is patterned by the technique of laser ablation using a scanning or step-and-repeat exposure.

A layer of gate dielectric material 10 or a sequence of dielectric layers is then deposited on top of the semiconducting layer. The gate dielectric layer is selected such that the device exhibits optimum device performance in terms of field-effect mobility, gate leakage current and transistor OFF current, threshold voltage and subthreshold slope as well as environmental and operational stability. The selection of the gate dielectric is according to criteria known in the prior art (see for example, H. Sirringhaus, Adv. Mat. 17, 1 (2005)). A suitable choice of dielectric in combination with a polymer semiconductor such as poly-dioctylfluorene-co-bithiophene (F8T2), poly-3-hexylthiophene (P3HT) or polytriarylamine (PTAA) is polyisobutylene or polyvinylphenol, but preferably polymethylmethacrylate (PMMA) and polystyrene (PS) are used. Preferably, the gate dielectric material is deposited from solution, and care is taken that the solvent for the deposition of the first dielectric is selected such as to avoid swelling and dissolution of the semiconducting layer underneath (US2005274986). The dielectric material may be deposited in the form of a continuous layer, as illustrated by techniques such as, but not limited to, blade coating dip coating, curtain coating, meniscus coating, spray coating, or extrusion coating, inkjet printing, offset printing, gravure printing or flexographic printing. The typical thickness of the gate dielectric layer is between 150-1000 nm.

The gate dielectric may also be a multilayer with a low-k dielectric in contact with the semiconducting layer, and a high-k material deposited on top. In addition, the dielectric layer(s) need to be chosen such as to allow the gate interconnect line to be deposited on top of the dielectric layer(s) with ease. This might be achieved by depositing a further dielectric layer on top of the high-k dielectric material acting as a wetting layer.

Figure 4:
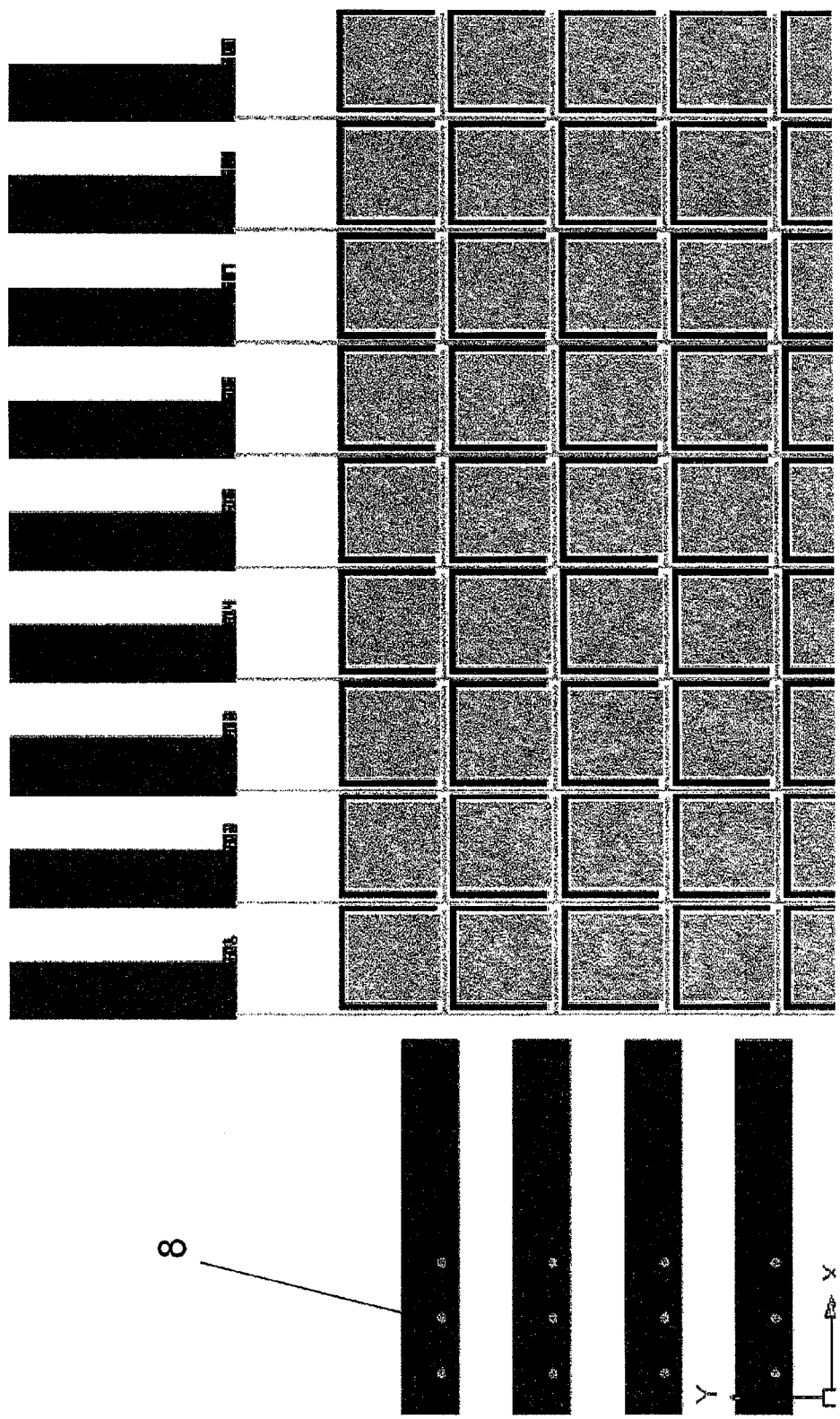
FIG. 4 illustrates a second array patterning step of the via hole integrated circuits.
Figure 5:
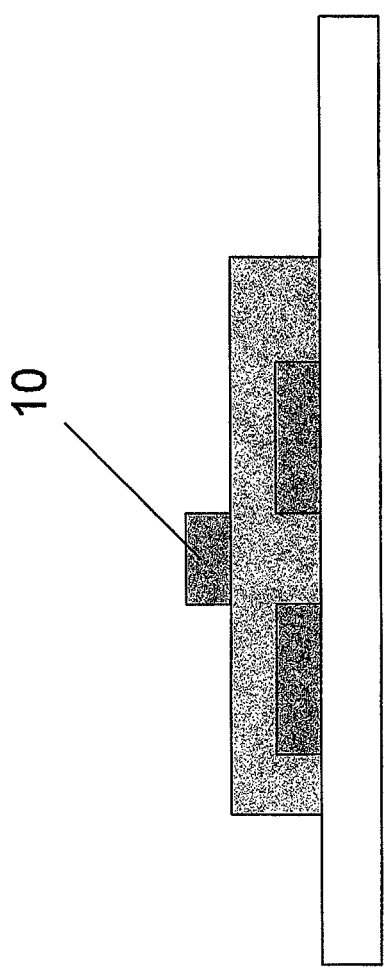
FIG. 5 shows the third array patterning step of the gate lines.
Figure 6:
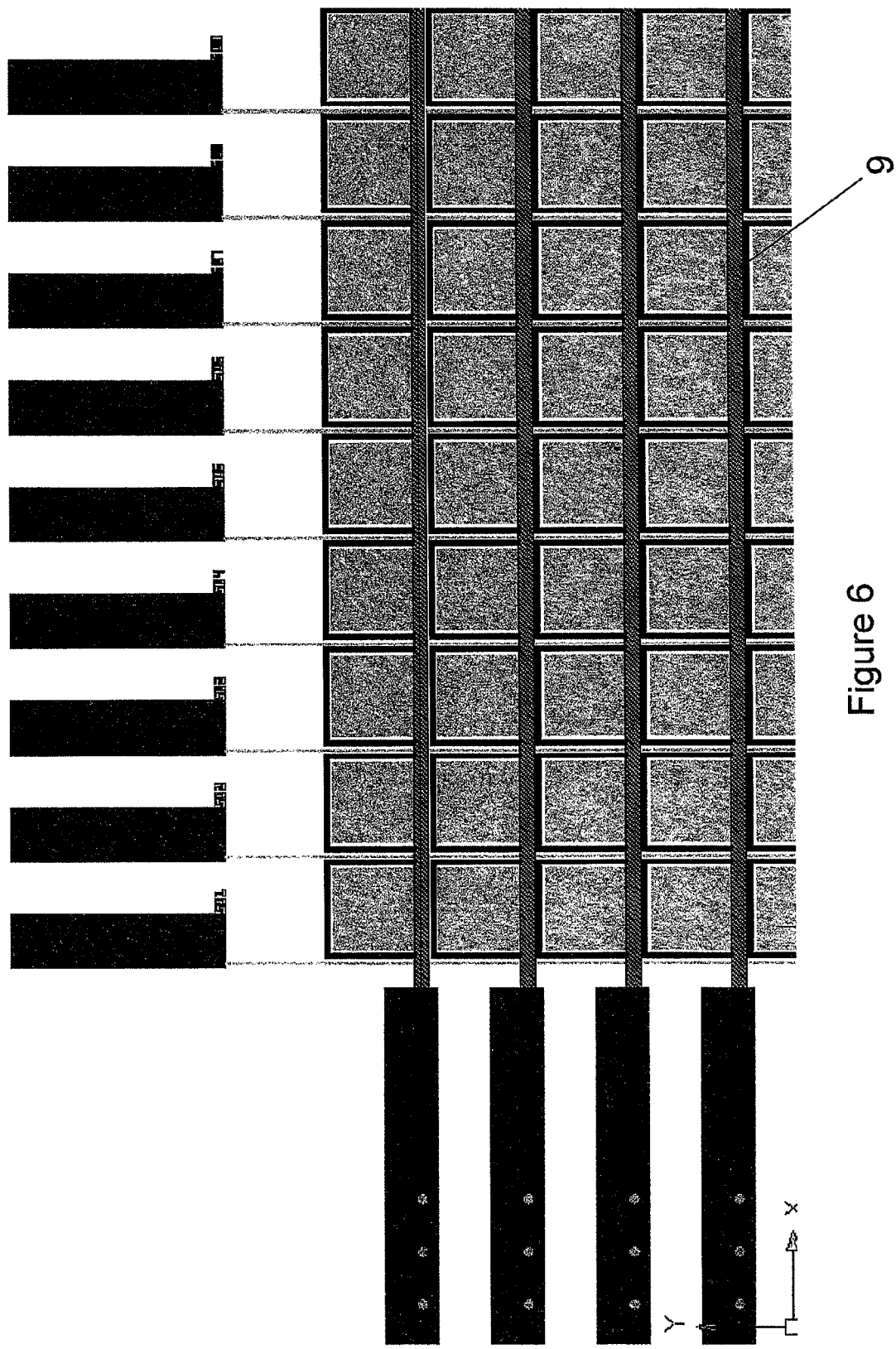
FIG. 6 illustrates the deposition of the gate electrode.

As a next step via-hole interconnections 8 are formed around the periphery of the active array of the display, as is shown in FIG. 4. Preferably, the via-holes are opened by laser ablation patterning using an excimer laser, but other techniques may be used. The deposition of the layer(s) of gate dielectric material is then followed by the deposition of a gate interconnect line 9. The gate interconnect line may consist of a conducting polymer, such as polyethylenedioxythiophene doped with polystyrene sulfonic acid (PEDOT/PSS) or a printable liquid containing inorganic nanoparticles of silver or gold. However, the gate electrode is preferably a high-conductivity metallic material, such as gold, deposited as a continuous film using techniques such as sputtering or evaporation. The conductivity of the gate interconnect line must be sufficiently high to drive the display. During the deposition the gate metal is also deposited into the via-holes that were defined in the previous step, and in this way an electrical connection between the gate electrode upper layer and the gate interconnects defined on the source-drain level is established.

In this top-gate configuration, the gate electrodes then need to be patterned into a regular array on the device with very precise alignment with respect to the underlying source-drain electrode and semiconducting active layer island. According to the present invention this is achieved preferably by the process of step-and-repeat SLAP. The metal film is selected to be sufficiently thin that it can be patterned in a single shot exposure by SLAP in a subsequent step. The patterning can be performed as a block-array using the distortion-tolerant processing method described here, since the gate structure is a regular array, and all non-periodic portions of the gate electrodes have been placed on the lower source-drain level.

After patterning of the gate electrode a top dielectric layer 12 may then be added to the layered stack. Preferably, the top dielectric layer is an organic dielectric material or a layer of organic-inorganic hybrid dielectric material. The layer of dielectric material may, for example, be a layer of chemical vapour deposited parylene. Alternatively, a number of layers of dielectric material may be deposited at this stage, including layers of material such as solution coated polystyrene or PMMA. These layers of dielectric material may be coated by any large area coating method, such as, but not limited to, spin coating, spray coating, or blade coating. The thickness of the layer is preferably in the range of 0.1-20 mm, more preferably in the range of 1 to 12 mm and most preferably in the range of 5-10 mm.

Figure 7:
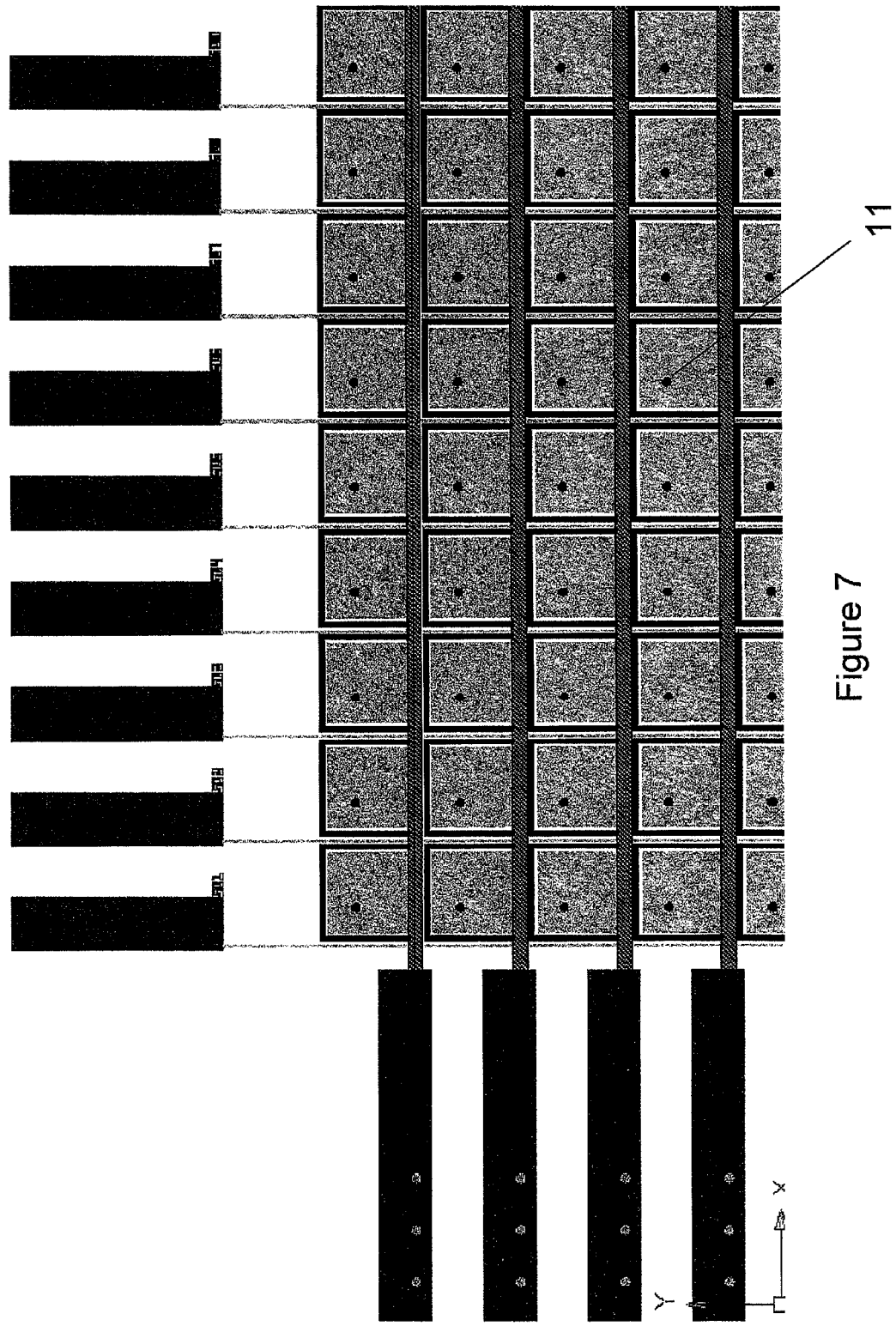
FIG. 7 shows the fourth array patterning step of the via holes.
Figure 8:
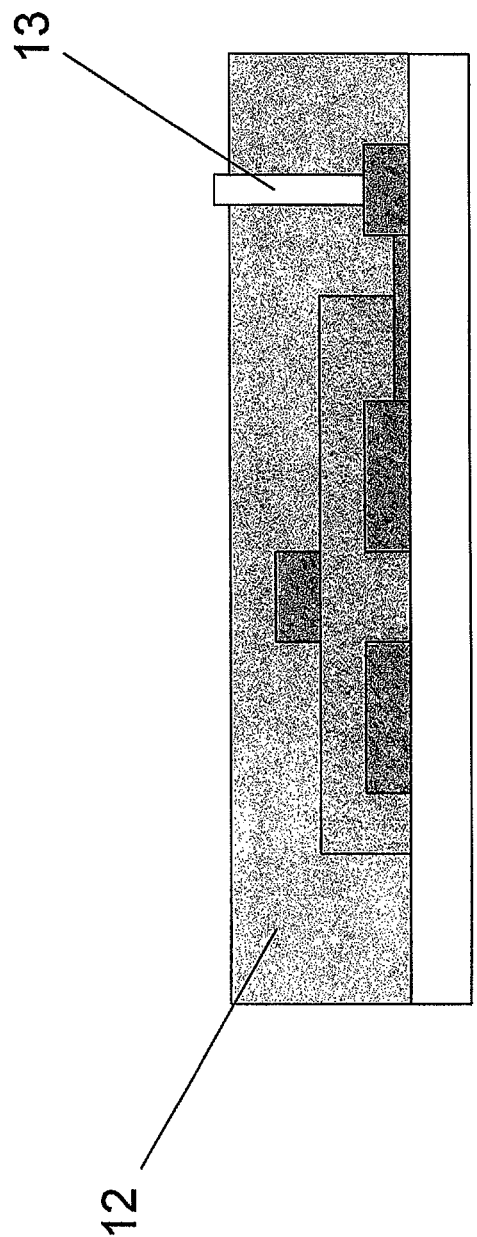
FIG. 8 illustrates the deposition of the dielectric layer(s) and the formation of a via.

A via hole 11 is then formed through this top pixel dielectric and down to the drain electrode for each TFT using a pulsed laser such as a YAG or excimer laser, as is seen in FIG. 7. If an excimer based process is used, then the patterning can be performed as a step-and-repeat exposure using the distortion-tolerant processing method described above, since the via structures must be formed on a regular array across the active area of the backplane. The formation of a via hole 13 through the dielectric layer 12 is illustrated further in FIG. 8.

Alternative techniques for via hole opening and via fabrication, and other selective connection formation techniques such as selective removal of layers, are described at pages 32 to 39 of WO 01/47043, with reference to FIGS. 12 to 15.

Figure 9:
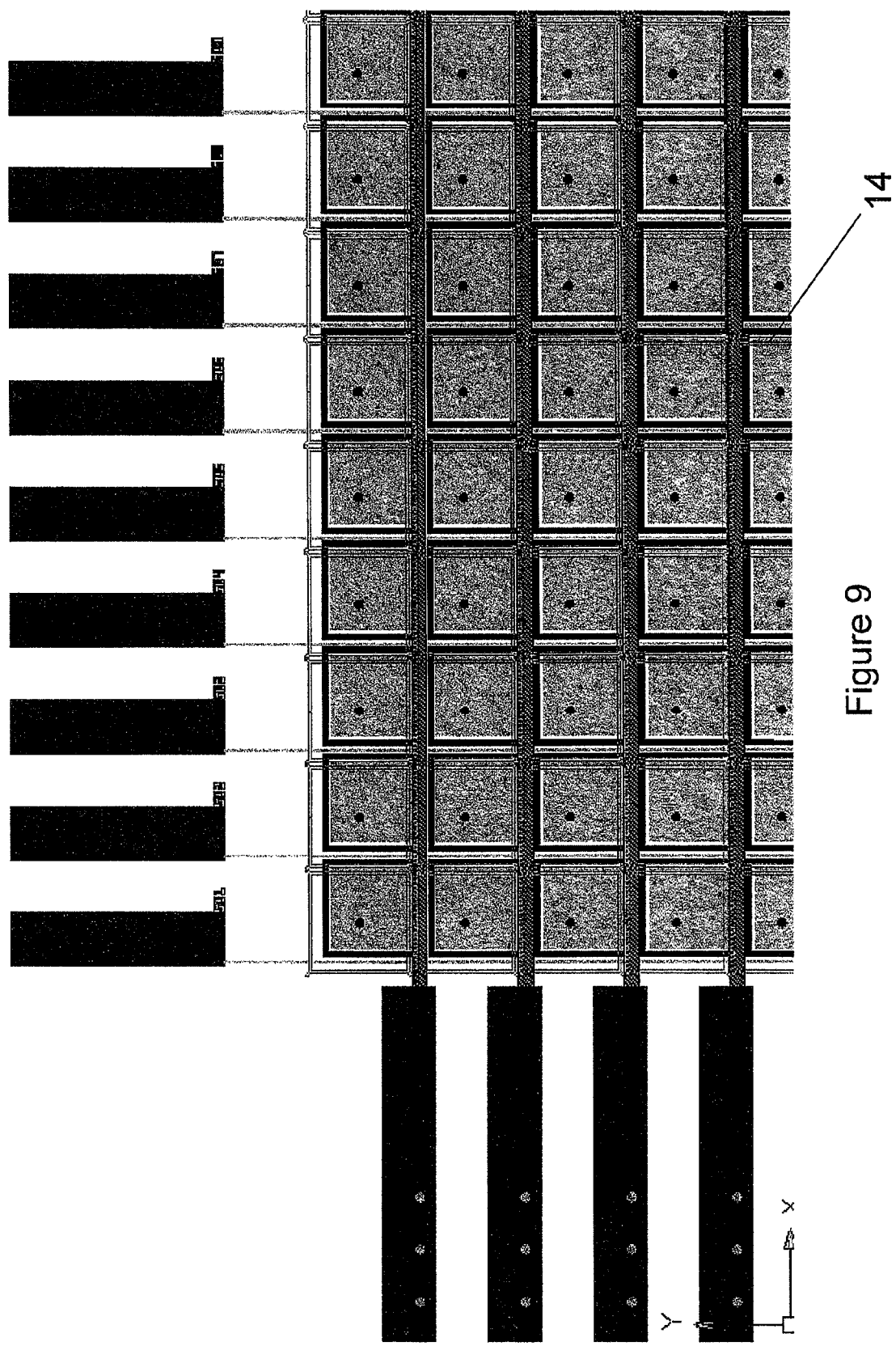
FIG. 9 shows the sixth array patterning of the top pixel electrodes.
Figure 10:
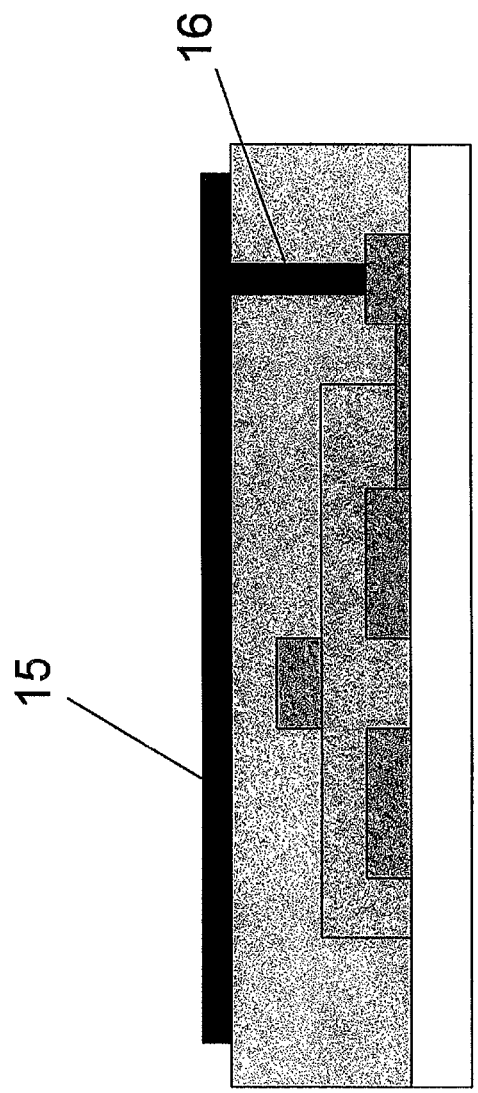
FIG. 10 illustrates the deposition of the top pixel electrode and the filling of the via hole interconnection.

The top level pixel electrode is then formed and preferably consists of a conducting polymer, such as polyethylenedioxythiophene doped with polystyrene sulfonic acid (PEDOT/PSS) and is deposited using techniques such as ink jet printing. The top pixel layer also forms a regular array on the device as is illustrated in FIG. 9 and therefore may be patterned 14 as in a step-and-repeat fashion using the techniques of laser ablation. The deposition of the conductive material 15 to form the top pixel electrode also fills the via hole interconnect 16 to form an electrical connection between the drain pad and the top pixel electrode as is shown in FIG. 10.

The display is then completed by laminating the active matrix array with a display medium such as an electrophoretic display medium. The display medium only covers the active matrix array and as a final step of the process the connection areas on the edges of the display are cleaned of any material deposited during the manufacturing process, and flexible connectors are attached to the interconnects defined on the source-drain level to connect the TFT array to the gate and data driver chips.

The present invention is not limited to the foregoing examples. Aspects of the present invention include all novel and inventive aspects of the concepts described herein and all novel and inventive combinations of the features described herein.

For the semiconducting layer any vacuum or solution processible conjugated polymeric or oligomeric material that exhibits adequate field-effect mobilities exceeding 10-3 cm2/Vs, preferably exceeding 10-2 cm2/Vs, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic semiconductor nano-wires (X. Duan, Nature 425, 274 (2003)).

The upper level electrodes may be patterned with distortion compensation by other step-and-repeat techniques such as, but not limited to, step-and-repeat photolithography.

The integrated circuit may be a different display device, such as an active matrix display comprising a bottom-gate TFT architecture, in which case the layout is modified analogously to the one described in the example above, or a passive matrix display. The patterning process may also be used to pattern other components of such circuits, such as interconnect lines, capacitors, inductors, diodes and the like. The integrated circuit might also be a different array device, such as, but not limited to, a memory array, an array of light- or X-ray sensors or an array of other sensing devices, such as chemical, or biological sensors.

The integrated circuit might also contain a digital logic circuit or an analogue integrated circuit. An example of this would be the integrated drivers for either the data line drivers, or the gate drivers, or for both integrated on the edge of a display. In this case the technique according to the present invention to avoid patterning of non-repetitive patterns on upper layers can also be applied by appropriate layout of the logic circuits. In the case of a complex logic circuit it might not always be possible to layout the entire circuit in such a way that upper layer patterns do not contain non-repetitive patterns. However, the method according to the present invention can be applied for all patterns that require accurate layer-to-layer alignment, such as the gate to source-drain alignment of the TFTs. To achieve this the TFTs of the logic circuit might be laid out on a periodic array, and only the interconnects connected the TFT might contain non-repetitive patterns. Such non-repetitive patterns do not require precise relative alignment and might be patterned on upper layers in separate patterning steps.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. An integrated circuit (IC) for driving a flexible display, comprising:
   a first layer comprising a pattern of first features, said first layer being deposited on a flexible substrate, and wherein said first features comprise one or more of data lines, interconnects for thin film transistors. flexible connectors, test patterns, and alignment marks, and wherein said first features comprise:

a first set of first features regularly repeating in only a first direction in the plane of the substrate; and a second set of first features regularly repeating in only a second direction in the plane of the substrate, the second direction orthogonal to the first direction; and a second layer comprising a pattern of repetitive second features as an array, said second layer being deposited on said first layer, wherein said second features comprise one or more of source, drain and gate electrodes for thin film transistors, and wherein said pattern of the second laver is deposited by depositing a material and patterning said material using a step and repeat mask-based process to:

deposit and pattern a first set of the second features in a first area of the second layer;

translate said substrate from a first position at which said first set of the second features is depositable to a second position at which a second set of the second features is depositable in a second area of the second lager;

deposit and pattern said second set of the second features in said second area; and repeat said step and repeat deposition process to deposit and second features;

wherein said first and second layers are aligned to one another so as to allow electrical coupling between said first and second features, and wherein the mask is configured such that the first area is smaller than the entire array and the second area is smaller than the entire array wherein each of said first and second areas are locally aligned to apply local distortion compensation during deposition of said pattern of repetitive second features to enable said alignment.

2. An integrated circuit according to claim 1, wherein said first features are deposited along an edge portion of said first layer.

3. An integrated circuit according to claim 1, wherein said second features on said second layer are electrically coupled to said first features on said first layer by via connectors between said second and first layers.

4. An integrated circuit according to claim 1, wherein said first features are deposited on the lowest layer of said substrate.

5. An integrated circuit according to claim 1, wherein said first layer further comprises second features, and wherein said second features are coupled to said first features.

6. An integrated circuit according to claim 1, wherein one or both of said second and first features comprises an organic solution-processed polymer semiconductor.

7. An integrated circuit according to claim 1, wherein said flexible substrate comprises polyethyleneterephtalate (PET) or polyethylenenaphtalene (PEN).

8. An integrated circuit according to claim 1, wherein said integrated circuit is an active matrix driver for driving a flexible display.

9. A display incorporating an integrated circuit according to claim 1.

* * * * *